United States Patent
Widjaja et al.

(10) Patent No.: US 6,819,697 B2
(45) Date of Patent: Nov. 16, 2004

(54) MOISTURE PASSIVATED PLANAR INDEX-GUIDED VCSEL

(75) Inventors: Wilson H. Widjaja, Cupertino, CA (US); Frank Hu, San Jose, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/341,085

(22) Filed: Jan. 13, 2003

(65) Prior Publication Data

US 2004/0136426 A1 Jul. 15, 2004

(51) Int. Cl.[7] .................................................. H01S 5/00
(52) U.S. Cl. .......................................... 372/45; 372/43
(58) Field of Search .............................. 372/43, 45, 46, 372/96

(56) References Cited

U.S. PATENT DOCUMENTS

| | | |
|---|---|---|
| 5,719,893 A | 2/1998 | Jiang et al. |
| 5,802,091 A * | 9/1998 | Chakrabarti et al. .......... 372/49 |
| 5,896,408 A | 4/1999 | Corzine et al. |
| 5,978,408 A * | 11/1999 | Thornton ...................... 372/96 |

* cited by examiner

Primary Examiner—Tuyet Vo
Assistant Examiner—Leith A Al-Nazer

(57) ABSTRACT

Systems and methods of passivating planar index-guided oxide vertical cavity surface emitting lasers (VCSELS) are described. These systems and methods address the unique susceptibility of these devices to damage that otherwise might be caused by moisture intrusion into the etch holes that are used to form the index-guiding confinement regions. In one aspect, the invention features a VCSEL that includes a vertical stack structure having a substantially planar top surface. The vertical stack structure includes a top mirror, a bottom mirror, and a cavity region that is disposed between the top mirror and the bottom mirror and includes an active light generation region. At least one of the top mirror and the bottom mirror has a layer with a peripheral region that is oxidized into an electrical insulator. The vertical stack structure defines an etched hole that extends from the substantially planar top surface to the oxidized peripheral region. The etched hole contains a polymer layer and is moisture passivated by an overlying moisture penetration barrier.

20 Claims, 4 Drawing Sheets

MOISTURE PASSIVATED PLANAR INDEX-GUIDED VCSEL

TECHNICAL FIELD

This invention relates to planar index-guided oxide vertical cavity surface emitting lasers (VCSELs) and methods of making the same.

BACKGROUND

A VCSEL is a laser device formed from an optically active semiconductor layer (e.g., AlInGaAs or InGaAsP) that is sandwiched between a pair of highly reflective mirror stacks, which may be formed from layers of metallic material, dielectric material or epitaxially-grown semiconductor material. Typically, one of the mirror stacks is made less reflective than the other so that a portion of the coherent light that builds in a resonating cavity formed in the optically active semiconductor layer between the mirror stacks may be emitted from the device. Typically, a VCSEL emits laser light from the top or bottom surface of the resonating cavity with a relatively small beam divergence. VCSELs may be arranged in singlets, one-dimensional or two-dimensional arrays, tested on wafer, and incorporated easily into an optical transceiver module that may be coupled to a fiber optic cable.

In general, a VCSEL may be characterized as a gain-guided VCSEL or an index-guided VCSEL. An implant VCSEL is the most common commercially available gain-guided VCSEL. An implant VCSEL includes one or more high resistance implant regions for current confinement and parasitic reduction. An oxide VCSEL, on the other hand, is the most common laterally index-guided VCSEL. An oxide VCSEL includes oxide layers (and possibly implant regions) for both current and optical confinement.

VCSELs and VCSEL arrays have been successfully developed for single-mode operation and multi-mode operation at a variety of different wavelengths (e.g., 650 nm, 850 nm, 980 nm, 1300 nm and 1550 nm). The commercial success of VCSEL technology, however, will depend in large part upon development of VCSEL structures that are characterized by high performance and high reliability.

Techniques have been proposed for improving the performance and reliability of VCSELs. For example, U.S. Pat. No. 5,719,893 describes a scheme for passivating ridge and implant VCSELs against physical and chemical damage. In accordance with this scheme, a layer of insulating material covers the entire VCSEL structure, including the light-emitting aperture region and the surrounding top metal electrode. The insulating material has an optical thickness that is an integral multiple of one half of the wavelength of light that the VCSELs are designed to emit. The passivating layer covers the entire VCSEL device structure in order to protect the device from physical and chemical damage.

SUMMARY

The invention features a scheme (systems and methods) of passivating planar index-guided VCSELs that addresses the unique susceptibility of these devices to damage that otherwise might be caused by moisture intrusion into the etch holes that are used to form the index-guiding confinement regions.

In one aspect, the invention features a VCSEL that includes a vertical stack structure having a substantially planar top surface. The vertical stack structure includes a top mirror, a bottom mirror, and a cavity region that is disposed between the top mirror and the bottom mirror and includes an active light generation region. At least one of the top mirror and the bottom mirror has a layer with a peripheral region that is oxidized into an electrical insulator. The vertical stack structure defines an etched hole that extends from the substantially planar top surface to the oxidized peripheral region. The etched hole contains a polymer layer and is moisture passivated by an overlying moisture penetration barrier.

In another aspect, the invention features an array of two or more of the above-described VCSEL.

In another aspect, the invention features a method of manufacturing the above-described VCSEL.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

Figure 1A:
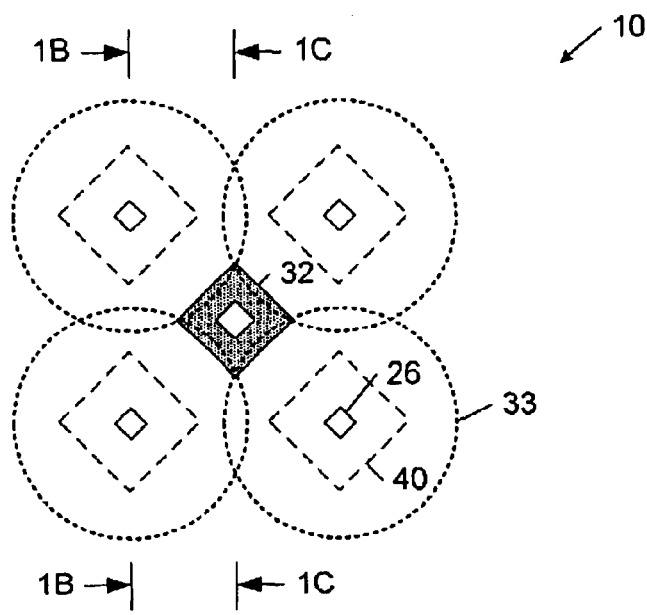
FIG. 1A is a diagrammatic top view of a planar VCSEL with four etched holes that are moisture passivated by an overlying moisture penetration barrier.
Figure 1B:
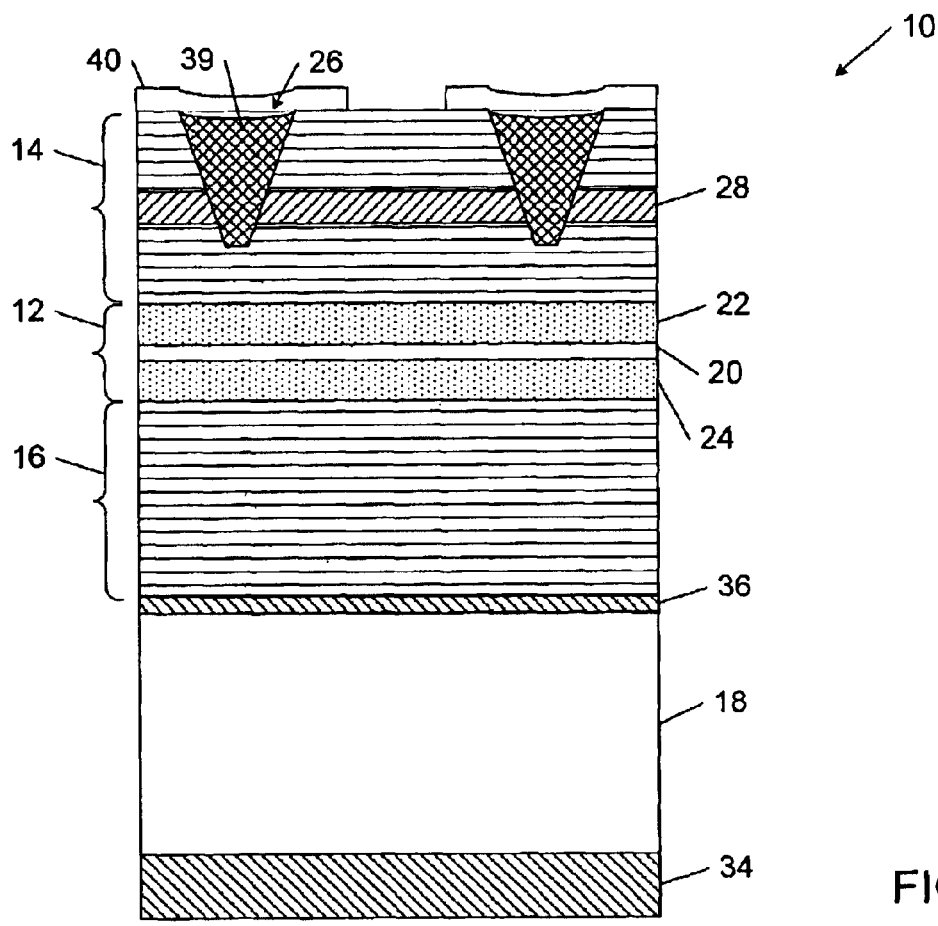
FIG. 1B is a diagrammatic cross-sectional side view of the planar VCSEL of FIG. 1A taken along the line 1B—1B.
Figure 1C:
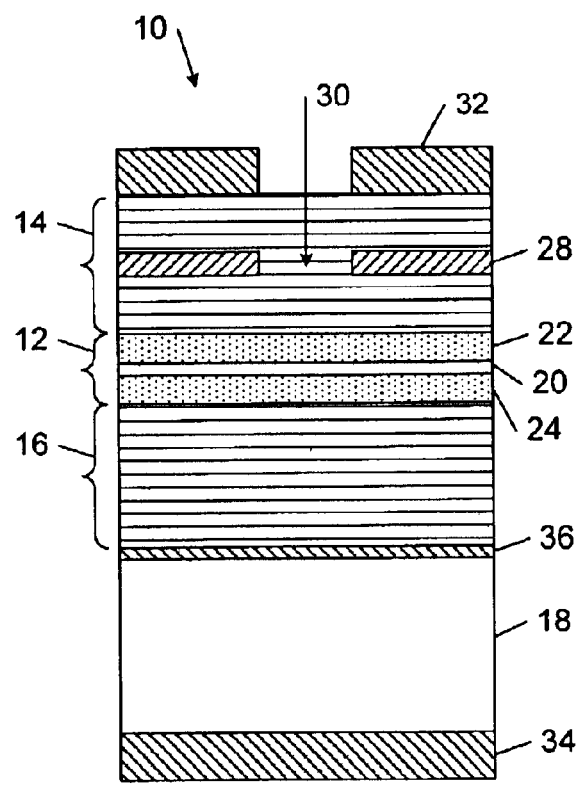
FIG. 1C is a diagrammatic cross-sectional side view of the planar VCSEL of FIG. 1A taken along the line 1C—1C.

Referring to FIGS. 1A, 1B and 1C, in one embodiment, a planar index-guided VCSEL 10 includes a cavity region 12 sandwiched between a first mirror stack 14 and a second mirror stack 16, which is formed on a substrate 18. Cavity region 12 includes one or more active layers 20 (e.g., a quantum well or one or more quantum dots) that are sandwiched between a pair of spacer layers 22, 24. In other embodiments, active layer 20 may be located above or below a single spacer layer. As shown, in this embodiment, VCSEL 10 has a planar structure that includes a number of holes 26 that expose a number of respective side regions of first mirror stack 14 to be oxidized. At least a portion 28 of first mirror stack 14 is oxidized from the exposed side regions inwardly toward a centrally located aperture region 30. In this embodiment, four holes 26 are opened at locations that are equidistant from the center of a first electrical contact 32. Holes 26 extend from the substantially planar top surface of first mirror stack 14 down at least to the layer (or layers) corresponding to oxidized portion 28. In the illustrated embodiment, each etch hole 26 has a depth of about 8 μm and a width of about 26 μm at the top surface of first mirror stack 14. When the VCSEL structure is exposed to heated water vapor, the heated water vapor enters holes 26 and oxidizes portion 28 in a radial direction away from holes 26. The oxidation process continues until the oxidation front 33 from each hole 26 merges to form the un-oxidized aperture region 30. Other VCSEL embodiments may include more or fewer exposure holes 26, or holes with different shapes, such as divided arcs or rings.

Electrical contact 32 together with a second electrical contact 34, which is located at the opposite end of the device, enable VCSEL 10 to be driven by a suitable driving circuit. In operation, an operating voltage is applied across electrical contacts 32, 34 to produce a current flow in VCSEL 10. In general, current flows through a central region of the VCSEL structure and lasing occurs in a central portion of cavity region 12 (hereinafter the "active region"). The oxidized portion 28 of first mirror stack 14 forms an oxide confinement region that laterally confines carriers and photons. Carrier confinement results from the relatively high electrical resistivity of the confinement region, which causes electrical current preferentially to flow through a centrally located region of VCSEL 10. Optical confinement results from a substantial reduction of the refractive index of the confinement region that creates a lateral refractive index profile that guides the photons that are generated in cavity region 12. The carrier and optical lateral confinement increases the density of carriers and photons within the active region and, consequently, increases the efficiency with which light is generated within the active region.

Active layer 20 may be formed from AlInGaAs (i.e., AlInGaAs, GaAs, AlGaAs and InGaAs), InGaAsP (i.e., InGaAsP, GaAs, InGaAs, GaAsP, and GaP), GaAsSb (i.e., GaAsSb, GaAs, and GaSb), InGaAsN (i.e., InGaAsN, GaAs, InGaAs, GaAsN, and GaN), or AlInGaAsP (i.e., AlInGaAsP, AlInGaAs, AlGaAs, InGaAs, InGaAsP, GaAs, InGaAs, GaAsP, and GaP). Other quantum well layer compositions also may be used. First and second spacer layers 22, 24 may be formed from materials chosen based upon the material composition of the active layers. First and second mirror stacks 14, 16 each includes a system of alternating layers of different refractive index materials that forms a distributed Bragg reflector (DBR) designed for a desired operating laser wavelength (e.g., a wavelength in the range of 650 nm to 1650 nm). For example, first and second mirror stacks 14, 16 may be formed of alternating layers of high aluminum content AlGaAs and low aluminum content AlGaAs. The layers of first and second mirror stacks 14, 16 preferably have an effective optical thickness (i.e., the layer thickness multiplied by the refractive index of the layer) that is about one-quarter of the operating laser wavelength. Substrate 18 may be formed from GaAs, InP, sapphire ($Al_2O_3$), or InGaAs and may be undoped, doped n-type (e.g., with Si) or doped p-type (e.g., with Zn). A buffer layer 36 may be grown on substrate 18 before VCSEL 10 is formed. In the illustrative representation of FIG. 1, first and second mirror stacks 14, 16 are designed so that laser light is emitted from the top surface of VCSEL 10. In other embodiments, the mirror stacks 14, 16 may be designed so that laser light is emitted from the bottom surface of substrate 18.

VCSEL 10 may be formed by conventional epitaxial growth processes, such as metal-organic chemical vapor deposition (MOCVD) and molecular beam epitaxy (MBE).

Figure 2:
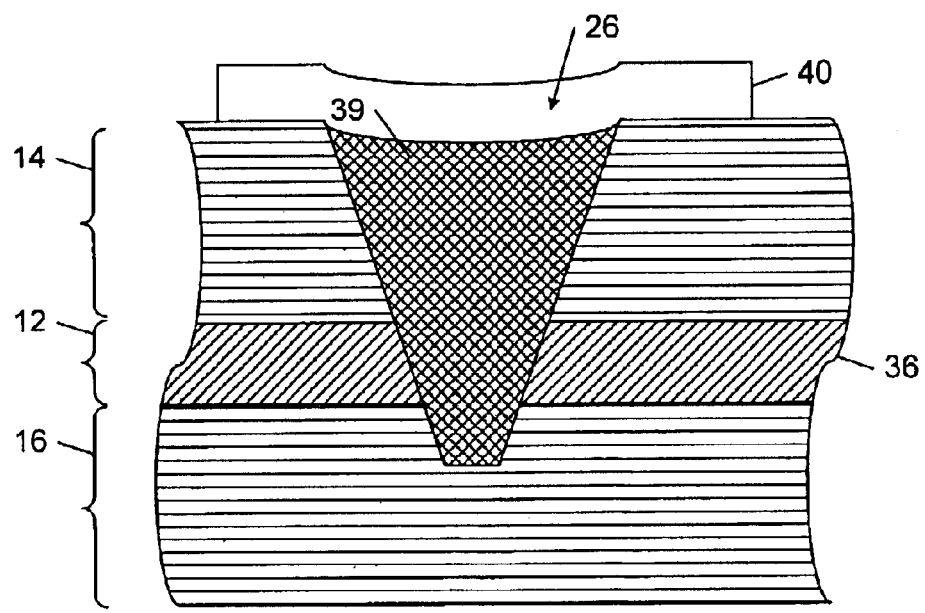
FIG. 2 is an enlarged diagrammatic cross-sectional side view of a region in the vicinity of an etched hole of the VCSEL of FIGS. 1A–1C.

As shown in FIGS. 1A, 1B and 2, in the illustrated embodiment, each etched hole 26 of VCSEL 10 contains a polymer layer 39 and an overlying moisture penetration barrier 40 that passivates each of the etched holes 26. The combination of polymer layer 39 and moisture penetration barrier 40 addresses the unique susceptibility of VCSEL 10 to damage that otherwise might be caused by moisture intrusion into the etch holes 26. In particular, it has been observed that unpassivated and non-hermetically sealed planar index-guided VCSELs are subject to a high rate of catastrophic failure in humid environments. Under high-humidity conditions, the lifetime of such VCSEL devices may be limited to on the order of a few hundred hours, which is substantially less than the $10^5$ hour lifetimes that are observed for similar VCSEL devices under standard high-temperature, harsh aging conditions.

Polymer layer 39 covers defects and particles on the surfaces of each etched hole 26, thereby planarizing the etched hole surfaces for the overlying moisture penetration barrier 40. In this way, polymer layer 39 allows a uniform and complete moisture penetration barrier 40 to be formed over each etched hole 26. In the illustrated embodiment, moisture penetration barrier 40 corresponds to a thin film layer that is patterned into a set of four rectangular patches. Each patch extends over a respective etched hole 26 to reduce moisture intrusion into the etched holes 26 and, thereby, substantially delay or effectively prevent moisture-related damage to VCSEL 10. Polymer layer 39 also serves as an ionic getter that absorbs and traps ionic contaminants that might penetrate through moisture penetration layer 40. In this way, polymer layer 39 protects VCSEL 10 against damage from such ionic contamination.

Polymer layer 39 may be formed from any electrically insulating polymer material that is compatible with the process technology that is used to fabricate VCSEL 10. In some embodiments, polymer 39 is photosensitive (or photochemical active); whereas in other embodiments, polymer 39 is not photosensitive. In some embodiments, polymer layer 39 is characterized by a relatively high glass transition temperature ($T_g$) (e.g., preferably about 200° C. or greater and, more preferably, about 350° C. or greater) and a relatively low coefficient of thermal expansion (CTE) (e.g., about 60 ppm/° C. or less). On some embodiments, polymer layer 39 may be formed of any one of a wide variety of known positive and negative photoresist compositions. In some embodiments, polymer layer 39 is a polyimide. Exemplary photosensitive polyimides that may be used as polymer layer 39 and certain characteristic properties of these polyimides are identified in the following table.

| Polyimide | $T_g$ (° C.) | Cure Temp. (° C.) | CTE (ppm/° C.) | Initial Weight Loss Temp. (° C.) | Decomposition Temp. (° C.) | Water Absorption |
|---|---|---|---|---|---|---|
| Hitachi HD-4000 | 350–360 | 375 | 35 | 420 (1%) | 530 | — |
| NSC V-259PA | 220 | 200 | 60 | 320 (5%) | — | 1.2% |
| Arch 7500 | >350 | 350 | 27 | >400 (1%) | >510 | 1.3% |

Hitachi HD-4000 is available from HD Microsystems L.L.C.,
NSC V-259PA is available from Nippon Semiconductor Corporation, and
Arch 7500 is available from Arch Chemicals, Inc.

A selected polymer composition may be applied to the substantially planar top surface of VCSEL 10 after the layer (or layers) corresponding to portion 28 has been oxidized using a conventional photoresist spin coating apparatus. The resulting polymer layer typically will have a thickness selected to cover defects and particles on the surfaces of each etched hole 26. In some embodiments, the polymer layer has a thickness of about 2 $\mu$m or greater. In the illustrated embodiment, the resulting polymer layer substantially fills holes 26. In other embodiments, the resulting polymer layer may overfill each hole 26 and extend over the substantially planar top surface of VCSEL 10 in regions surrounding the top edge of each hole 26. The polymer layer may be removed from selected areas of the substantially planar top surface using conventional photolithography techniques. For example, photosensitive polymer layers may be exposed through a patterned mask and either the exposed or the unexposed regions of the polymer layer may be removed in a developer depending on whether the polymer is positively or negatively photosensitive. Non-photosensitive polymer layers may be masked by an overlying patterned photoresist layer and regions of the polymer layer that are exposed through the mask may be removed by etching.

Moisture penetration barrier 40 may be formed from any moisture-resistant material that is compatible with the process technology that is used to fabricate VCSEL 10. In some embodiments, moisture penetration barrier 40 is formed from an electrically insulating material (e.g., a nitride material, such as silicon nitride, silicon oxynitride, and titanium-tungsten nitride, or an oxide material, such as silicon oxide and titanium oxide). In other embodiments, moisture penetration barrier 40 is formed from a metal. In one embodiment, moisture penetration barrier 40 is a low stress, high density silicon nitride layer that is deposited using a conventional low-pressure chemical vapor deposition process and has a thickness between about 100 nm and about 600 nm.

Figure 3:
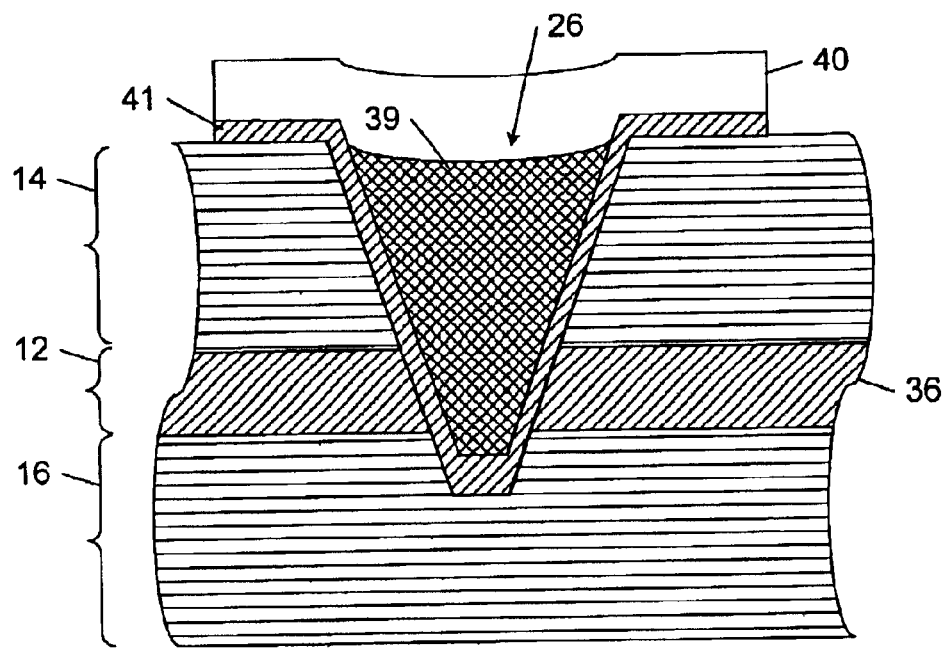
FIG. 3 is an enlarged diagrammatic cross-sectional side view of a region in the vicinity of an etched hole of a VCSEL.

Referring to FIG. 3, in some embodiments, a dielectric layer 41 is disposed between the surfaces of each hole 26 and polymer layer 39. Dielectric layer 41 may be formed of any electrically insulating and moisture-resistant material that is compatible with the process technology used to fabricate VCSEL 10, including a nitride material (e.g., silicon nitride), an oxynitride material (e.g., silicon oxynitride), and an oxide material (e.g., silicon dioxide). In one embodiment, dielectric layer 40 is a low stress, high density silicon nitride layer that is deposited using a conventional low-pressure chemical vapor deposition process and has a thickness between about 100 nm and about 600 nm. In the illustrated embodiment, dielectric layer 41 extends up to the substantially planar surface of VCSEL 10 and beyond the periphery of edge of each hole 26. Moisture penetration barrier 40 is formed over the peripheral edges of dielectric layer 41 to encapsulate polymer layer 39.

Figure 4:
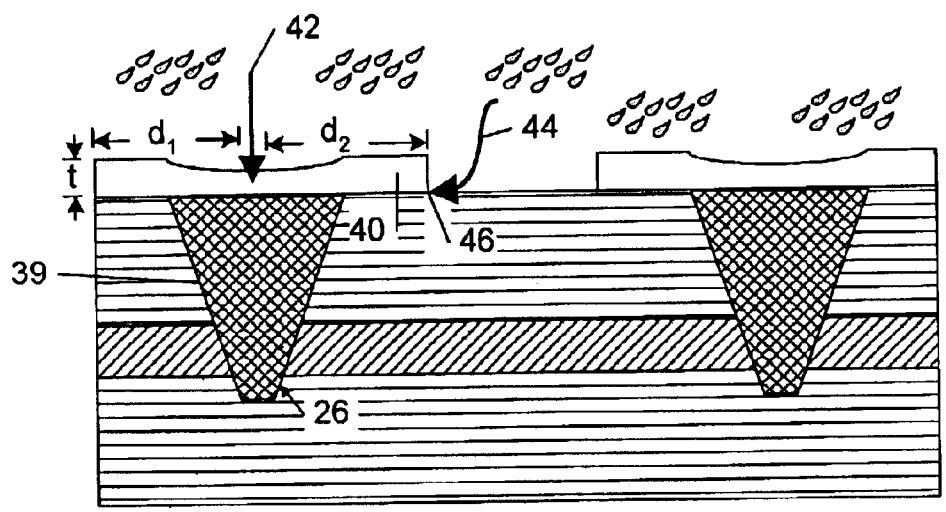
FIG. 4 is a diagrammatic cross-sectional side view of a top surface region of the planar VCSEL exposed to a moisture environment.

Referring to FIG. 4, in some embodiments, moisture penetration barrier 40 has a thickness (t) that is sufficient to prevent substantial vertical moisture intrusion 42 into the etched holes 26. As explained in U.S. patent application Ser. No. 10/013,108, which was filed Dec. 7, 2002, and is incorporated herein by reference, the VCSEL failure rate in high humidity environments has been observed to decrease dramatically with passivation layer thickness after the passivation layer thickness reaches a first threshold. Beyond a second threshold, however, the decrease in failure rate is substantially less pronounced. In one embodiment, moisture penetration barrier 40 is formed from silicon nitride that is deposited in accordance with a conventional low stress silicon nitride deposition process. In this embodiment, the first threshold thickness is approximately 300 nm and the second threshold thickness is approximately 500 nm. In other embodiments, the actual values for the threshold thicknesses will depend upon a number of factors, including the material properties of moisture penetration barrier.

In some embodiments, moisture penetration barrier 40 extends laterally beyond the edges of the etched holes 26 by a distance ($d_1$, $d_2$) that is sufficient to substantially prevent lateral moisture intrusion into the etched holes 26. Lateral moisture intrusion may result from leakage along a path extending to the etched holes from a moisture penetration interface 46, which is formed at the intersection of the top surface of first mirror stack 14 and the peripheral edges of moisture penetration barrier 40. In some embodiments having a silicon nitride moisture penetration barrier, the separation distances ($d_1$, $d_2$) between the peripheral edges of the moisture penetration barrier and the peripheral edges of the etched holes at the top surface of first mirror stack 14 are on the order of approximately 15 $\mu$m or greater. In some embodiments, the separation distance between the peripheral edge of the moisture penetration barrier and the peripheral edges of the etched holes may be constrained in one or more directions depending upon other device structures on the top surface of first mirror stack 14. For example, in some embodiments, the light emission region is substantially free of any overlying moisture penetration barrier material, in which case the separation distance cannot exceed the separation distance between the etched holes and the light emission region.

Figure 5:
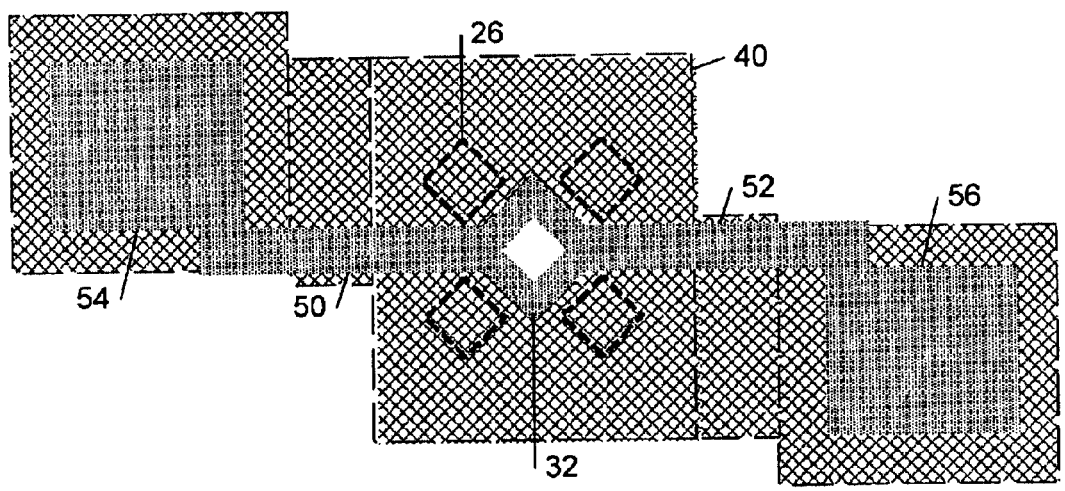
FIG. 5 is a diagrammatic top view of a planar VCSEL with four etched holes that are moisture passivated by an overlying moisture penetration barrier.

Referring to FIG. 5, in some embodiments, lateral moisture intrusion may result primarily from delamination of the moisture penetration barrier 40 from the top surface of first mirror stack 14. In some embodiments, total film strain of moisture penetration barrier 40—which correlates with the probability that the moisture penetration barrier 40 will delaminate from the top surface of first mirror stack 14—decreases exponentially with surface area. In these embodiments, to reduce lateral moisture intrusion into etched holes 26, moisture penetration barrier 40 is patterned into patches each having a lateral surface area that is sufficient to reduce the film stress per unit area to a level that avoids substantial delamination of the moisture penetration barrier. In the embodiment of FIG. 5, moisture penetration barrier 40 is formed as a single continuous film of material that overlies a substantial portion of the top surface of the first mirror stack, including each of the etched holes 26. In these embodiments, moisture penetration barrier 40 has an area that is sufficient to avoid substantial delamination of the moisture penetration barrier 40 and, thereby, substantially reduces lateral moisture intrusion into etched holes 26. In some embodiments, moisture penetration barrier 40 extends over as much of the top surface of the first mirror stack as is available. In the illustrated embodiment, metal lines 50, 52 may extend over moisture penetration barrier 40 from electrode 32 to bonding pads 54, 56, which also are disposed over moisture penetration barrier 40.

VCSEL devices having a silicon nitride moisture penetration barrier 40 with the surface layout shown in FIG. 5 and a thickness of 500 nm have been demonstrated to have lifetimes that are ten times longer than the lifetimes of non-passivated devices in humid environments.

Other embodiments are within the scope of the claims. For example, although the above embodiments are described in connection with AlGaAs mirror stack systems, other semiconductor alloy compositions or dielectric layers may be used to form the DBR mirror structures.

What is claimed is:

1. A vertical cavity surface emitting laser (VCSEL), comprising:

a vertical stack structure having a substantially planar top surface, including a top mirror, a bottom mirror, a cavity region disposed between the top mirror and the bottom mirror and including an active light generation region, at least one of the top mirror and the bottom mirror having a layer with a peripheral region oxidized into an electrical insulator;

wherein the vertical stack structure defines an etched hole extending from the substantially planar top surface to the oxidized peripheral region, the etched hole containing a polymer layer and being moisture passivated by an overlying moisture penetration barrier.

2. The VCSEL of claim 1, wherein the polymer layer comprises a polyimide.

3. The VCSEL of claim 1, wherein the polymer layer comprises a photosensitive polymer.

4. The VCSEL of claim 1, wherein the polymer layer is characterized by a coefficient of thermal expansion of about 60 ppm/° C. or less.

5. The VCSEL of claim 1, wherein the polymer layer is characterized by a glass transition temperature of about 200° C. or greater.

6. The VCSEL of claim 1, wherein the polymer layer is characterized by a glass transition temperature of about 350° C. or greater.

7. The VCSEL of claim 1, wherein the polymer layer has a thickness of about 2 µm or greater.

8. The VCSEL of claim 1, wherein the polymer layer fills the etched hole up to the substantially planar top surface.

9. The VCSEL of claim 1, wherein the moisture penetration barrier is electrically insulating.

10. The VOSEL of claim 9, wherein the moisture penetration barrier comprises a nitride.

11. The VCSEL of claim 9, wherein the moisture penetration barrier is formed of one of the following materials: silicon nitride, silicon oxynitride, and titanium-tungsten nitride.

12. The VCSEL of claim 11, wherein the moisture penetration barrier is formed of silicon nitride and has a thickness between about 100 nm and about 600 nm.

13. The VCSEL of claim 9, wherein the moisture penetration barrier is formed of one of the following materials: silicon oxide and titanium oxide.

14. The VCSEL of claim 1, wherein the moisture penetration barrier is formed of a metal.

15. The VCSEL of claim 1, further comprising a dielectric layer disposed between the polymer layer and sidewalls of the etched hole.

16. The VCSEL of claim 15, wherein the dielectric layer and the moisture penetration barrier encapsulate the polymer layer.

17. The VCSEL of claim 1, wherein:

the moisture penetration barrier includes a peripheral edge intersecting the top surface of the vertical stack structure at a moisture penetration interface; and at the top surface of the vertical stack structure the etched hole is circumscried by a respective peripheral edge having a substantial portion separated from the moisture penetration interface by a distance of approximately 15 µm or greater.

18. The VCSEL of claim 1, wherein the vertical stack structure defines multiple etched holes each extending from the substantially planar top surface to the oxidized peripheral region, each etched hole containing a polymer layer and being moisture passivated by an overlying moisture penetration barrier.

19. An array of two or more vertical cavity surface emitting lasers (VCSELs), each VCSEL comprising:

a vertical stack structure having a substantially planar top surface, including a top mirror, a bottom mirror, a cavity region disposed between the top mirror and the bottom mirror and including an active light generation region, at least one of the top mirror and the bottom mirror having a layer with a peripheral region oxidized into an electrical insulator;

wherein the vertical stack structure defines an etched hole extending from the substantially planar top surface to the oxidized peripheral region, the etched hole containing a polymer layer and being moisture passivated by an overlying moisture penetration barrier.

20. A method of manufacturing a vertical cavity surface emitting laser (VCSEL), comprising:

forming a vertical stack structure having a substantially planar top surface, including a top mirror, a bottom mirror, a cavity region disposed between the top mirror and the bottom mirror and including an active light generation region, at least one of the top mirror and the bottom mirror having a layer with a peripheral region oxidized into an electrical insulator;

etching the vertical stack structure to form an etched hole extending from the substantially planar top surface to the oxidized peripheral region;

forming a polymer layer in the etched hole; and forming a moisture penetration barrier over the polymer layer and the etched hole.

* * * * *